United States Patent
Puschner et al.

(10) Patent No.: US 7,397,140 B2
(45) Date of Patent: Jul. 8, 2008

(54) CHIP MODULE

(75) Inventors: Frank Puschner, Kelheim (DE);
Dietmar Dengler, Landsberg (DE);
Wolfgang Schindler, Regenstauf (DE);
Thomas Spottl, Regensburg (DE)

(73) Assignees: Infineon Technologies AG (DE); Delo Industire Klebstoffe GmbH + Co. KG (DE)

( * ) Notice: Subject to any disclaimer, the term of this patent is extended or adjusted under 35 U.S.C. 154(b) by 218 days.

(21) Appl. No.: 11/206,241

(22) Filed: Aug. 16, 2005

(65) Prior Publication Data
US 2006/0049532 A1    Mar. 9, 2006

(30) Foreign Application Priority Data
Aug. 16, 2004  (DE) .................... 10 2004 039 693

(51) Int. Cl.
*H01L 23/29* (2006.01)
*H01L 23/02* (2006.01)

(52) U.S. Cl. ............... 257/788; 257/679; 257/687; 257/789; 257/795; 257/783; 257/E23.064; 257/E23.114; 257/E23.116

(58) Field of Classification Search ......... 257/788–795, 257/E31.117, E33.059, 678–680, 257–733, 257/783, 787–796, E23.001–E23.194; 361/737, 361/752
See application file for complete search history.

(56) References Cited

U.S. PATENT DOCUMENTS

| | | | |
|---|---|---|---|
| 5,036,024 A * | 7/1991 | Mine et al. | 29/827 |
| 5,399,441 A | 3/1995 | Bearinger et al. | |
| 5,536,765 A * | 7/1996 | Papathomas | 524/100 |
| 5,709,948 A | 1/1998 | Perez et al. | |
| 6,255,738 B1 | 7/2001 | Distefano et al. | |
| 6,404,068 B1 * | 6/2002 | Tanaka et al. | 257/787 |
| 7,108,914 B2 * | 9/2006 | Skipor et al. | 428/402.21 |

FOREIGN PATENT DOCUMENTS

| | | |
|---|---|---|
| DE | 42 10 127 A1 | 10/1992 |
| DE | 195 15 187 C2 | 11/1996 |
| DE | 197 50 147 A1 | 5/1999 |
| EP | 1 114 845 A1 | 7/2001 |
| EP | 1 005 509 B1 | 1/2002 |
| JP | 59-221352 A | 12/1984 |

* cited by examiner

*Primary Examiner*—Jasmine J Clark
(74) *Attorney, Agent, or Firm*—Dickstein, Shapiro, LLP.

(57) ABSTRACT

A chip module having a chip which is mounted by means of chip adhesive on a mount and is electrically connected via bonding wires to contact pads, and an encapsulation compound which surrounds the chip and the bonding wires and is bounded by a subarea of the mount. The encapsulation compound is radiation-hardened and heat-hardened in a combined form and has radiation-impermeable pigments.

17 Claims, 2 Drawing Sheets

CHIP MODULE

CROSS-REFERENCE TO RELATED APPLICATION

This application claims priority to German Patent Application Serial No. 102004039693.0, which was filed Aug. 16, 2004 and is incorporated herein by reference in its entirety.

FIELD OF THE INVENTION

The invention relates to a chip module, in particular to a chip module for smart cards, which comprises a chip which is mounted by means of chip adhesive on a mount and is electrically connected via bonding wires to contact pads.

BACKGROUND OF THE INVENTION

UV-curing encapsulation compounds are predominantly used in mass production, owing to the fast curing time. Approximately 90% of all chip modules for smart cards are encapsulated with encapsulation compounds such as these. The encapsulation compounds must be permeable to light, in order to allow them to cure all the way through. Alternatively, thermally curing encapsulation compounds are used. These need not be permeable to light and are often colored black. However, thermal curing has the disadvantage that it is too slow for mass production with a curing time of up to 3 minutes, and forms a relatively brittle encapsulation compound in the cured state. In comparison to this, UV-curing encapsulation compounds require only 30 to 40 seconds for curing, and thus satisfy the speed requirements of chip module manufacturers.

Since smart cards are used for identification and authentication in the field of banks and for access monitoring, the security of the data stored in the smart card is subject to very stringent requirements. If it is possible to read secret data from a smart card, or to manipulate it, then, in the worst case, it may be necessary for the system operator to shut down the system, to block all cards and to issue new cards which are immune to attack. The financial damage and the loss of confidence would be immense.

Attacks are made on weaknesses of smart cards at all levels. An attack at the physical level may, for example, make use of the free access of light to the chip in the chip module. It would thus be possible in the visible spectrum at wavelengths from 400 nm to 700 nm to read secret keys with the aid of an optical microscope. Thermal measurements in the infrared range from 700 to 2500 nm could be used to determine which parts of the chip circuit are heated, that is to say are currently operating. In this way, for example, it would be possible to determine the procedure sequence in an algorithm. Apart from optical analysis, free access of light to the chip also allows the chip to be deliberately disturbed, and a subsequent malfunction to be made use of. This could be done, for example, by irradiation of the chip with photons, which release electrons from the semiconductor lattice, and could thus deliberately lead to a change in the memory content or manipulation of data.

Optical analysis and influencing the chip by irradiation in the wavelength range from 200 nm to 2500 nm can be avoided by the use of light-impermeable encapsulation compounds, although these are not suitable for mass production of smart cards, owing to the slow curing time and their brittle nature.

SUMMARY OF THE INVENTION

A chip module having a chip which is mounted by means of chip adhesive on a mount and is electrically connected via bonding wires to contact pads, and an encapsulation compound which surrounds the chip and the bonding wires and is bounded by a subarea of the mount. The encapsulation compound is radiation-hardened and heat-hardened in a combined form and has radiation-impermeable pigments.

DETAILED DESCRIPTION OF PREFERRED EMBODIMENTS OF THE INVENTION

Figure 1:
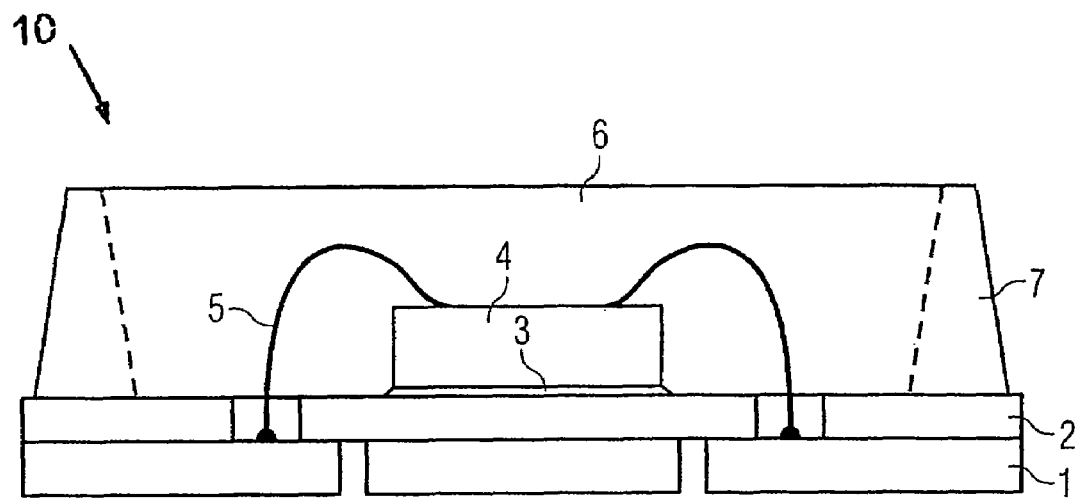
FIG. 1 shows an exemplary embodiment of a chip module according to the present invention.

The invention relates to a chip module for smart cards, which comprises a chip which is mounted by means of chip adhesive on a mount and is electrically connected via bonding wires to contact pads. The chip and the bonding wires are in this case surrounded by an encapsulation compound which is bounded by a subarea of the mount. The encapsulation compound, also referred to as "glob top", protects the sensitive bonding wires and the chip against environmental influences such as moisture and against mechanical loads. One variant of the glob top is the "dam and fill" method, which is particularly suitable when flat dimensions with an exact external contour are required. In this method, a dam composed of a high-viscosity material is first of all placed around the chip and the bonding wires, and is then filled with a low-viscosity material. Once a chip module has been encapsulated, it is connected to the card body, and thus forms a smart card.

One object of the invention is to specify a chip module and a method for production of a chip module such as this which does not allow access by radiation to the chip in the wavelength range from 200 nm to 2500 nm, and which at the same time can be produced such that it is compliant with the stringent speed requirements for mass production.

According to the invention, this object is achieved in that the encapsulation compound is radiation-hardened and heat-hardened in a combined form and has radiation-impermeable pigments and thus specifying a method for production of a chip module such as this.

The coloring of the encapsulation compound with radiation-impermeable pigments makes it impermeable to radiation. If radiation both in the visible range and in the infrared range is absorbed and reflected, optical analysis or deliberate disturbance by optical irradiation are no longer possible. The security of the chip module and thus of the smart card is thus advantageously improved.

As a result of the coloring of the encapsulation compound with radiation-impermeable pigments, it is no longer possible to cure the encapsulation compound just by UV rays. According to the invention, the encapsulation compound is additionally thermally cured. This combined curing with UV curing and thermal curing is carried out very quickly since, even though the penetration depth of the UV radiation through the pigments is restricted, a part of the UV radiation enters the encapsulation compound and leads to rapid curing on the surface. The simultaneous thermal curing ensures complete curing of the internal parts of the encapsulation compound, which the UV radiation does not reach. In comparison to the previously known purely thermal curing, combined curing comprising UV curing and thermal curing is virtually just as fast as pure UV curing, and leads to a more flexible, less brittle, cured encapsulation compound. In contrast to the previously known pure UV curing, combination curing allows the use of radiation-impermeable pigments in the encapsulation compound, and thus improves the security of the chip in chip modules against attack.

The radiation-impermeable pigments of the encapsulation compound in the cured state advantageously absorb radiation in the wavelength range from 200 nm to 2500 nm. This makes it possible to prevent optical analyses and attacks on the chip in this radiation range, which is particularly suitable for this purpose. The choice of the pigments allows the encapsulation compound to easily be matched to the desired optical characteristics. A further advantage is that the coloring is a relatively simple process.

In one development, the encapsulation compound of the chip module has fillers with little alpha radiation. Alpha radiation means the decomposition of radioactive elements such as uranium and thorium, in which an alpha particle is produced, comprising two protons and two neutrons. If an alpha particle such as this penetrates into the substrate of the chip, then electron hole pairs can be produced which lead to transient currents, as a result of drift and diffusion. These currents can lead to state changes in memory modules. This effect is referred to as a "soft error" and occurs in particular in the case of components with a high transistor density, small structures and low supply voltages. In encapsulation compounds which have quartzes ($SiO_2$) with low contamination levels of uranium and thorium as fillers, the alpha radiation can have a particularly negative effect owing to the immediate proximity of the chip and encapsulation compound, and the large-scale-integrated structures. The use of fillers with little alpha radiation in the encapsulation compound leads to an advantageous reduction in the occurrence of soft errors, particularly in the case of chip modules with structural widths of less than 0.13 µm.

The fillers in the encapsulation compound advantageously have alpha radiation of less than 100 alpha particles per hour per square meter. The use of fillers with as little radiation as this, which have been rid of radioactive contamination or are obtained by decomposition of a substance that produces little radiation, makes it possible to further improve the security of the chip module and of the smart card, since it is very largely possible to preclude accidental disturbances caused by alpha radiation.

The encapsulation compound is advantageously a flexible cationically polymerizing epoxy. An epoxy such as this can be processed very well and has excellent mechanical characteristics.

It is particularly advantageous for the encapsulation compound to have a modulus of elasticity of <1000 MPa. An encapsulation compound such as this is sufficiently elastic in order not to break even when subjected to severe mechanical stresses.

In a similar manner, the encapsulation compound advantageously has a Shore D hardness of <90. An encapsulation compound such as this is sufficiently flexible to absorb shock-type forces.

In one advantageous embodiment, the chip adhesive has conductive substances. The addition of electrically conductive material, such as silver particles or carbon in the adhesive, makes it possible to prevent potential building up in it. Furthermore, a conductive chip adhesive makes it possible to improve the electrical characteristics of the chip, by capacitive linking.

The chip adhesive advantageously has a modulus of elasticity of <5000 MPa. In combination with the modulus of elasticity of the encapsulation compound of <1000 MPa, this makes it possible to produce a chip module whose mechanical characteristics are very well matched to the highly dynamic loads which occur, for example, in a postal distribution system.

The chip adhesive preferably has a Shore D hardness of <100. This guarantees that the chip adhesive does not become too hard and thus brittle, thus breaking once subjected to mechanical loads. Furthermore, it is easier to measure the Shore D hardness of adhesives than the modulus of elasticity.

It is advantageous for the chip adhesive to be a flexible, cationically polymerizing epoxy. This allows very good process compatibility to be achieved with the encapsulation compound, since this is likewise a flexible, cationically polymerizing epoxy so that there is no need to be concerned about negative chemical interactions between the chip adhesive and the encapsulation compound. Furthermore, this makes it possible to achieve a very good connection at the junctions between the chip adhesive and the encapsulation compound. This connection is particularly important, since cracks occur at precisely these points as a result of mechanical loads, such as those which occur when a smart card is bent, and the encapsulation compound could become detached from the smart card, or moisture could penetrate.

The chip adhesive is expediently thermally curing. This has the advantage that there is no need for free access of light for curing, and the mount and the chip can thus be designed to be opaque.

The light-impermeable pigment is advantageously compatible with cationic radiation and thermal curing.

Preferably, the pigments are metal oxides, or are

Preferably, the pigments are spinel-based metal oxides.

Preferably, the pigments amount to at least 2 percent per weight of the total composition of the encapsulation compound.

Preferably, the pigments amount to less than 20 percent per weight of the total composition of the encapsulation compound.

FIG. 1 shows one exemplary embodiment of a chip module. The chip module 10 comprises a mount 2, on one of whose faces a chip 4 is mounted by means of chip adhesive 3. The contact pads 1 of the smart card are fitted on the other face of the mount 2. The chip 4 is electrically connected to the contact pads 1 via the bonding wires 5. The chip 4 and the bonding wires are surrounded by the encapsulation compound 6. A dam 7 prevents the liquid encapsulation compound 6 from running out. The finished chip module is installed in a card body, which is not illustrated, in order to complete the smart card.

The contact pads 1 form the externally accessible contacts of the smart card.

The mount 2 is in the form of a flexible printed circuit board with a metallization coating, and is preferably composed of epoxy material. Bonding holes are provided in the mount 2, through which the chip 4 can be connected via the bonding wires 5 to the contact pads 1.

The chip adhesive 3 is used for mounting the chip 4 on the mount 2. The chip adhesive 3 is subject to particular requirements in order to make it possible to withstand the high dynamic loads which occur as a result of bending of the smart cards when being dispatched using a postal distribution system. It must not be too brittle, since it would otherwise become delaminated when bending loads are applied, and the chip 4 would tear off, with the bonding wire 5. For this reason, the modulus of elasticity of the chip adhesive 3 is chosen to be less than 5000 MPa. Alternatively or in addition to this, the chip adhesive has a Shore D hardness of less than 100.

In addition, the chip adhesive 3 contains conductive substances. These are composed, for example, of carbon or silver particles and contribute to preventing the formation of electrical potentials within the chip adhesive 3. Filling with conductive material also improves the capacitive coupling of the chip 4.

The chip adhesive 3 is a cationically polymerizing epoxy which is thermally curing.

The encapsulation compound 6 protects the chip 4 and the chip wires 5 against contamination and mechanical damage. Radiation-impermeable pigments are added to the encapsulation compound 6 in order to provide defense against optical attacks and analyses. The pigments are distinguished in that they provide absorption over a wide wavelength range and are compatible with cationic polymerization. The encapsulation compound is thus impermeable for radiation in the wavelength range from 200 nm to 2500 nm in the cured state.

The encapsulation compound 6 is structured using the dam and fill method, as is indicated by the straight side edges and upper face in the drawing. First of all, a dam 7 is produced around the chip 4 and the bonding wires 5, the material of which dam 7 corresponds essentially to that of the encapsulation compound 6, but which has a higher viscosity in the uncured state. The dam 7 contains the same fillers and pigments as the encapsulation compound 6, and has the same characteristics in the cured state. The region bounded by the dam 7 is then filled with the encapsulation compound 6, and the two together are cured by radiation and heat. Since the dam 7 is subsequently connected to the encapsulation compound 6 to form a unit, it is shown by dashed lines in FIG. 1. Thus, when the expression "encapsulation compound" is used in the following text, this always also means the dam 7 as well.

Since chips 4 with a very high transistor density and very small structure widths of less than 0.13 μm are frequently used in smart cards, fillers with low alpha radiation are used in order to avoid soft errors in the encapsulation compound 6. The alpha radiation from the fillers is less than 100 alpha particles per hour per square meter.

The coloring with pigments means that pure UV curing of the encapsulation compound 6 is no longer possible. However, purely thermal curing of the encapsulation compound 6 is too slow for mass production and results in relatively brittle encapsulation compounds 6, which tend to crack when subjected to severe mechanical loads. The encapsulation compound 6 is thus cured by UV and thermally cured, in a combined form, at the same time.

One fact of very particular importance for the mechanical characteristics is that the encapsulation compound 6 is optimally matched to the chip adhesive 3. Like the chip adhesive 3, the encapsulation compound 6 is thus composed of a flexible cationically polymerizing epoxy, and has a modulus of elasticity of less than 1000 MPa, and/or a Shore D hardness of less than 90. This means that the encapsulation compound 6 and the chip adhesive 3 do not chemically influence one another, and form a good connection to one another at the separating layer between the encapsulation compound 6 and the chip adhesive 3. This very largely precludes the encapsulation compound 6 from cracking away from the chip adhesive 3 on the flank, when subject to severe mechanical loads.

Figure 2:
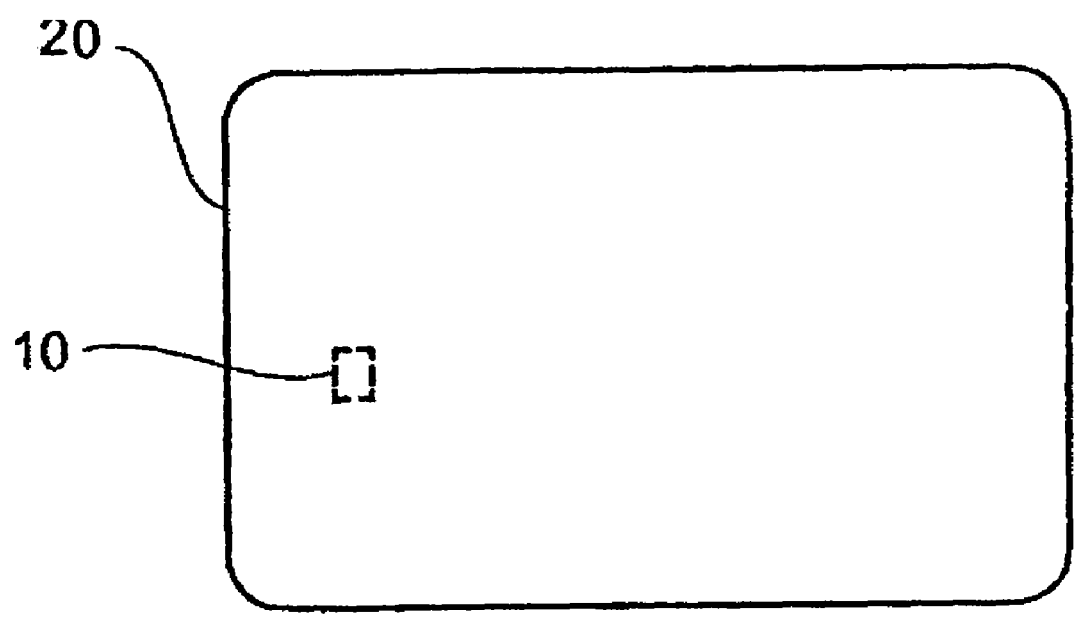
FIG. 2 shows an exemplary embodiment of a chip card body housing the chip module of FIG. 1.

FIG. 2 shows an exemplary embodiment of a chip card body 20 housing the chip module 10 of FIG. 1.

What is claimed is:

1. A chip module, comprising:
   a chip which is mounted by means of chip adhesive on a mount and is electrically connected via bonding wires to contact pads; and
   an encapsulation compound which surrounds the chip and the bonding wires and is bounded by a subarea of the mount,
   wherein the encapsulation compound is radiation-hardened and heat-hardened in a combined form and has radiation-impermeable pigments.

2. The chip module as claimed in claim 1, wherein the encapsulation compound is impermeable in the cured state for radiation in the wavelength range from 200 nm to 2500 nm.

3. The chip module as claimed in claim 1, wherein the encapsulation compound has fillers with low alpha radiation.

4. The chip module as claimed in claim 3, wherein the alpha radiation has less than 100 alpha particles per hour per $m^2$.

5. The chip module as claimed in claim 1, wherein the encapsulation compound is a flexible, cationically polymerizing epoxy resin.

6. The chip module as claimed in claim 1, wherein the encapsulation compound has a modulus of elasticity of less than 1000 MPa.

7. The chip module as claimed in claim 1, wherein the encapsulation compound has a Shore D hardness of less than 90.

8. The chip module as claimed in claim 1, wherein the chip adhesive has conductive substances.

9. The chip module as claimed in claim 1, wherein the chip adhesive has a modulus of elasticity of less than 5000 MPa.

10. The chip module as claimed in claim 1, wherein the chip adhesive has a Shore D hardness of less than 100.

11. The chip module as claimed in claim 1, wherein the chip adhesive is a flexible, cationically polymerizing epoxy.

12. The chip module as claimed in claim 1, wherein the chip adhesive is thermally curing.

13. The chip module as claimed in claim 1, wherein the radiation-impermeable pigments are metal oxides.

14. The chip module as claimed in claim 13, wherein the radiation-impermeable pigments are spinel-based metal oxides.

15. The chip module as claimed in claim 14, wherein the radiation-impermeable pigments amount to at least 2 percent per weight of the total composition.

16. The chip module as claimed in claim 13, wherein the radiation-impermeable pigments amount to less than 20 percent per weight of the total composition.

17. A card body comprising the chip module of claim 1.

* * * * *

UNITED STATES PATENT AND TRADEMARK OFFICE
CERTIFICATE OF CORRECTION

PATENT NO. : 7,397,140 B2  
APPLICATION NO. : 11/206241  
DATED : July 8, 2008  
INVENTOR(S) : Puschner et al.

Page 1 of 1

It is certified that error appears in the above-identified patent and that said Letters Patent is hereby corrected as shown below:

On the face of the patent:

At column 1, under (73) Assignees, "Infineon Technologies AG (DE); Delo Industire Klebstoffe GmbH + Co. KG (DE)" should read --Infineon Technologies AG (DE); DELO Industrie Klebstoffe GmbH & Co. KG (DE)--

In the Specification:

At column 2, line 11, "BRIEF DESCRIPTION OF THE DRAWING" should read --BRIEF DESCRIPTION OF THE DRAWINGS--

At column 4, line 33, "oxides, or are" should read --oxides.--

Signed and Sealed this

Eighteenth Day of November, 2008

JON W. DUDAS  
*Director of the United States Patent and Trademark Office*